United States Patent
Saric et al.

(10) Patent No.: US 11,372,095 B2
(45) Date of Patent: Jun. 28, 2022

(54) PHASE-ADJUSTABLE INJECTION-LOCKING

(71) Applicant: NXP B.V., Eindhoven (NL)

(72) Inventors: Tarik Saric, Eindhoven (NL); Erwin Johannes Gerardus Janssen, Meijel (NL); Zhirui Zong, Eindhoven (NL); Juan Felipe Osorio Tamayo, Eindhoven (NL)

(73) Assignee: NXP B.V., Eindhoven (NL)

( * ) Notice: Subject to any disclaimer, the term of this patent is extended or adjusted under 35 U.S.C. 154(b) by 298 days.

(21) Appl. No.: 16/521,120

(22) Filed: Jul. 24, 2019

(65) Prior Publication Data
US 2021/0026002 A1 Jan. 28, 2021

(51) Int. Cl.
| | |
|---|---|
| G01S 13/40 | (2006.01) |
| G01S 7/35 | (2006.01) |
| H01Q 3/38 | (2006.01) |
| H04B 1/69 | (2011.01) |
| H01Q 3/42 | (2006.01) |
| H03D 7/00 | (2006.01) |

(52) U.S. Cl.
CPC .............. *G01S 13/40* (2013.01); *G01S 7/35* (2013.01); *H01Q 3/38* (2013.01); *H04B 1/69* (2013.01); *H01Q 3/42* (2013.01); *H03D 7/00* (2013.01); *H04B 2001/6912* (2013.01)

(58) Field of Classification Search
None
See application file for complete search history.

(56) References Cited

U.S. PATENT DOCUMENTS

| | | | |
|---|---|---|---|
| 9,099,956 B2 | 8/2015 | Eldesouki et al. | |
| 2016/0344397 A1 | 11/2016 | Matsumara | |
| 2017/0285139 A1* | 10/2017 | Higuchi | ................. H03L 7/191 |
| 2019/0013815 A1 | 1/2019 | Saric | |

FOREIGN PATENT DOCUMENTS

JP 2011247598 A 12/2011

OTHER PUBLICATIONS

JP2011247598 translation (Year: 2011).*
1998 Robert A. York, 'Injection- and Phase-Locking Techniques for Beam Control' IEEE Transactions on Microwave Theory and Techniques, vol. 46, No. 11, Nov. 1998.
Behzad Razavi, 'A Study of Injection Locking and Pulling in Oscillators', IEEE Journal of Solid-State Circuits, vol. 39, No. 9, Sep. 2004.

* cited by examiner

*Primary Examiner* — Whitney Moore

(57) ABSTRACT

Aspects of the present disclosure are directed to injection locking and related apparatuses. As may be implemented in accordance with one or more embodiments, an apparatus includes a plurality of injection-locking circuits configured to receive an injection signal, each injection-locking circuit including a mixer and a lock-detection circuit. In each of the injection-locking circuits, the lock-detection circuit detects a lock-status relationship between the injection signal and a signal output from the injection-locking circuit. In response to the lock-status relationship indicating an unlocked condition, a phase/magnitude of the injection signal is adjusted. In response to the lock-status relationship indicating a locked condition, transmission of an FM continuous wave (FMCW) chirp signal is facilitated.

20 Claims, 5 Drawing Sheets

PHASE-ADJUSTABLE INJECTION-LOCKING

OVERVIEW

Aspects of various embodiments are directed to injection locking, which may be facilitated by phase tuning of injection signals.

A variety of different types of circuitry may utilize injection locking. For instance, injection locking amplifiers can be used to lock injection signals for generating a variety of outputs, such as signals used in radar transceivers. Such approaches may, for example, be useful in the automotive industry where radar-based signals can be used for a variety of applications. Such a system may utilize several (differential) amplifying stages tuned at an operating frequency.

While useful, injection locking can be complex to implement, and utilize significant power in effecting locking functions. Further, lock range may be limited, amplitude may be undesirable large, and phase may vary over a signal. These and other matters have presented challenges to efficiencies of injection-locking implementations, for a variety of applications.

SUMMARY

Various example embodiments are directed to issues such as those addressed above and/or others which may become apparent from the following disclosure concerning injection locking, and doing so using a phase-adjustment approach.

In certain example embodiments, aspects of the present disclosure involve the use of a feedback and/or feed forward loop to adjust the phase of an output signal generated using an injection signal. Such an approach may, for example, be carried out by using a feedback circuit to ascertain differences in phase between the injection signal and an amplified version of the output signal, and adjusting the phase of the output signal based on any such ascertained differences.

In a more specific example embodiment, an apparatus includes a plurality of injection-locking circuits configured to receive an injection signal, each injection-locking circuit including a mixer and a lock-detection circuit. In each of the injection-locking circuits, the lock-detection circuit detects a lock-status relationship between the injection signal and an output signal from the injection-locking circuit. In response to the lock-status relationship indicating an unlocked condition, a phase of the output signal is adjusted. In response to the lock-status relationship indicating a locked condition, transmission of an FM continuous wave (FMCW) chirp signal is facilitated.

In another specific example embodiment, a method is carried out as follows. A plurality of injection-locking circuits are driven with an associated injection signal, in which each of the plurality of injection-locking circuits includes a mixer and a lock-detection circuit to adjust a phase of an output signal. In each of the plurality of injection-locking circuits, the lock-detection circuit is used to detect a lock-status relationship between the injection signal and the output signal from the injection-locking circuit. In response to the lock-status relationship indicating an unlocked condition, a phase of the output signal is adjusted. In response to the lock-status relationship indicating locked condition, an FM continuous wave (FMCW) chirp signal is output In other specific example embodiments, an apparatus comprises an antenna, an oscillator, an amplifier, an injection-locking circuit and a feedback circuit. The oscillator is configured and arranged to generate an oscillating FM continuous wave (FMCW) radar injection signal, which used to generate an output signal. The injection-locking circuit is configured to adjust the phase of the output signal based on a tuning voltage to provide a phase-adjusted FMCW output signal to the amplifier. The amplifier is configured and arranged to output an amplified version of the phase-adjusted FMCW output signal to the antenna for transmission. The feedback circuit is configured and arranged to supply the tuning voltage by comparing the phase of the output signal with the phase of the injection signal, in response to the comparing indicating a difference in the respective phases, setting the tuning voltage to cause the injection-locking circuit to adjust the phase of the output signal.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1A:
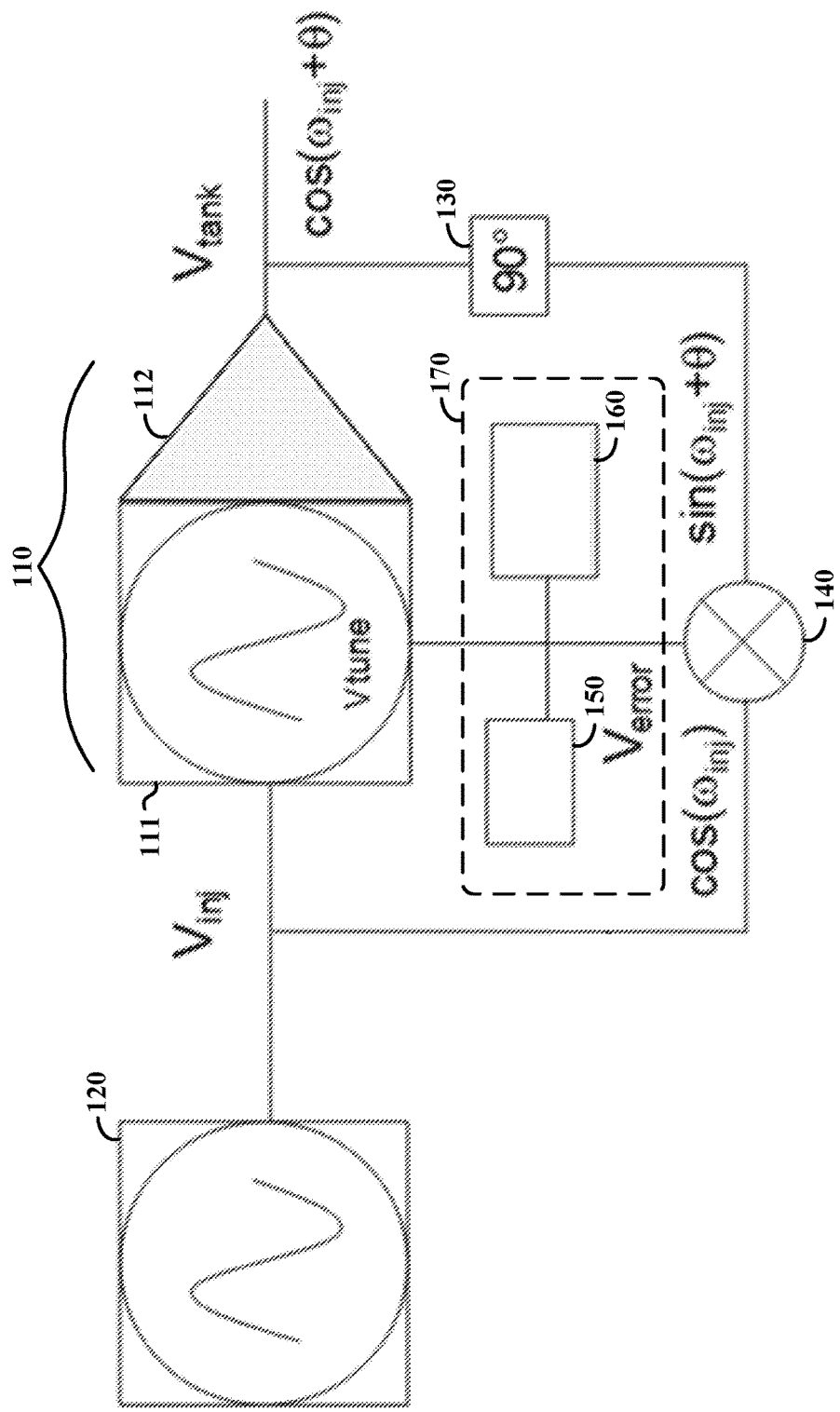
FIG. 1A shows an injection-locking apparatus, as may be accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving phase locking. In certain implementations, aspects of the present disclosure have been shown to be beneficial when used in the context of signal generation and amplification, such as may be used in automotive signaling applications including radar based applications. In some embodiments, the phase of an amplified FMCW radar chirp output signal is compared to the phase of an injection signal used to generate the chirp. The phase of the output signal is modified in response to the comparison indicating a phase difference. While not necessarily so limited, various aspects may be appreciated through the following discussion of non-limiting examples which use exemplary contexts.

In the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various embodiments are directed to the utilization of feedback for locking the phase of an output signal relative to an injection signal upon which the output signal is based. An oscillation frequency is tuned, such as by using a varactor having a tunable input voltage Vtune utilized in an injection locking stage. A feedback loop detects phase deviation between the signals and corrects to achieve phase lock. This approach may be achieved using a mixer which, once phase lock is achieved, provides zero output. This may involve applying a 90 degrees phase shift between an output signal and injection signal, or an opposing −45 degrees shift on the injected signal and a +45 degrees shift on the output signal (e.g., Vtank). This could be achieved by use of high pass and low pass filters respectively on Vtank and Vinj. In a more particular application, mixer circuitry is used to first mix down an injected signal and an oscillator signal to an intermediate frequency (IF), followed by phase frequency detector.

In various implementations, the corresponding injection locked stage is locked prior to activation of the feedback loop for tuning the phase. For instance, the same mixer used for phase detection can identify locking based on beat frequencies, with an RMS detector buffered and connected to a counter and latch to detect an unlocked condition. When implemented in a radar system, a first chirp can be initiated and a varactor voltage range defined based on chirp size. An RMS circuit is used to detect injection locking. If locking is not detected, an injection signal can be increased until injection locking is confirmed. Another chirp can be initiated to verify locking. A chirp sequence can then be initiated, utilizing feedback to ensure phase matching as characterized herein.

In a specific example embodiment, an apparatus includes an injection-locking circuit configured to receive an injection signal, and including a mixer and a lock-detection circuit. The lock-detection circuit detects a lock-status relationship between the injection signal and an output signal from the injection-locking circuit. If the lock-status relationship indicates an unlocked condition, a phase/magnitude of the output signal is adjusted. If the lock-status relationship indicates a locked condition, an FM continuous wave (FMCW) chirp signal may be transmitted. Such an approach may be carried out using a plurality of such injection-locking circuits, which may for example be used to amplify FMCW signals for transmission or to amplify received reflections of the FMCW signals (e.g., as mixed with an injection signal used in generating the transmissions from which the reflections are received). Various embodiments further include a phase-locked loop oscillator circuit that generates the injection signal for driving the injection-locking circuit, and an amplifier configured to amplify the a phase-adjusted version of the output signal.

The injection-locking circuits may be implemented in a variety of manners. In some embodiments, the mixer is configured to combine the injection signal and a representation of the output signal from the injection-locking circuit, and to provide an output indicative of a phase difference between the injection signal and the output signal. In certain embodiments, the injection-locking circuit adjusts the phase the output signal in response to a tuning voltage, such as by using a varactor. The lock-detection circuit may adjust the phase/magnitude of the output signal by setting a voltage range of the tuning voltage. For instance, the lock-detection circuit may include capacitor circuitry configured to cause the tuning voltage to exhibit a voltage in the tuning range. This tuning voltage effects a change in the phase of the output signal, facilitating locking.

Various embodiments are directed to feed-forward control of phase adjustment of an injection signal. For instance, a feed forward circuit may be configured to set an operating voltage of an injection-locking circuit based on an injection signal from an injection circuit. In certain feed-forward implementations, the injection-locking circuit adjusts the phase of an output signal generated using the injection signal, based on a tuning voltage. The feed forward circuit responds to an output of the injection oscillator by setting a voltage range of the tuning voltage. In various contexts, it has been recognized/discovered that, utilizing this phase-locking approach, a range of frequencies for which injection locking can be achieved can be increased, and amplitude variation may be reduced.

Various embodiments are directed to methods for injection locking. In accordance with a particular embodiment, a method is carried out as follows. A plurality of injection-locking circuits are driven with an associated injection signal, in which each of the plurality of injection-locking circuits includes a mixer and a lock-detection circuit to adjust a phase of an output signal generated based on the injection signal. In each of the plurality of injection-locking circuits, the lock-detection circuit is used to detect a lock-status relationship between the injection signal and the output signal from the injection-locking circuit. In response to the lock-status relationship indicating an unlocked condition, a phase of the output signal is adjusted. In response to the lock-status relationship indicating locked condition, an FM continuous wave (FMCW) chirp signal is output.

In various embodiments, a phase-locked loop oscillator circuit is used to drive each of the injection-locking circuits, in which an amplifier is driven using the injection signal. In some implementations, a mixer is used to combine a phase-adjusted output of the injection-locking circuit with a signal corresponding to the injection signal, and the lock-status relationship is detected based on an output of the mixer. In certain implementations, the mixer provides an output indicative of a phase difference between the injection signal and the output signal, and the phase of the output signal is adjusted based on the phase difference.

The phase of the output signal may be adjusted in a variety of manners. In some embodiments, a voltage range of a tuning voltage supplied to the injection-locking circuits is set and used to cause the injection-locking circuits to adjust the phase of the resulting output signal. In certain embodiments, a tuning voltage of a varactor is adjusted and therein causes the varactor to adjust the phase of the output signal.

Another embodiment is directed to an apparatus comprising an antenna, an oscillator, an amplifier, an injection-locking circuit and a feedback circuit. The oscillator is configured and arranged to generate an oscillating FM continuous wave (FMCW) radar injection signal. The injection-locking circuit is configured to us the FMCW injection signal to generate an output signal, and to adjust the phase of the output signal based on a tuning voltage to provide a phase-adjusted FMCW signal to the amplifier. The amplifier is configured and arranged to output an amplified version of the phase-adjusted FMCW signal to the antenna for transmission. The feedback circuit is configured and arranged to supply the tuning voltage by comparing the phase of an output of the amplifier with the phase of the injection signal. In response to the comparing indicating a difference in the respective phases, the feedback circuit sets the tuning voltage to cause the injection-locking circuit to adjust the phase of the output signal. The injection-locking circuit may, for example, transmit the amplified version of the phase-adjusted FMCW output signal in response to the comparing indicating that the respective phases match.

As characterized with one or more embodiments herein, the feedback circuit may include a mixer circuit that mixes an injection signal with an amplified version of the injection signal output via the amplifier and a lock-detection circuit that detects differences in the respective phases. A capacitor circuit adjusts the voltage of the output of the mixer circuit and to provide the adjusted output as the tuning voltage.

Turning now to the Figures, FIG. 1A shows an injection-locking apparatus 100, as may be implemented in accordance with the present disclosure. The apparatus 100 includes injection-locking circuitry 110 including a phase-tuning component 111 and an amplifier 112 (as may be implemented in a common circuit and/or as the same circuit), as well as feedback circuitry including a mixer 140 and feedback circuit block 170 that provide lock-detection and control of the phase-tuning component 111. Phase-tuning component 111 adjusts the phase of an output signal generated by the injection-locking circuitry, based on an injection signal that may be generated by an oscillator 120. This phase adjustment may be based on an input from feedback circuit block 170 and the amplifier 112 amplifies the phase-adjusted injection signal. The feedback circuit block 170 may, for example, control the phase-tuning component 111 by mixing an output of the amplifier 112 with the injection signal to detect differences in phase. If the phases are different, the phase-tuning component 111 is controlled to modify the phase of the output signal from the amplifier 112.

In various embodiments, the feedback circuit block 170 includes an injection locking detector 150, as may be implemented with an RMS detector and/or a voltage monitor, and a tuning circuit 160 (e.g., a filter that ensures stability of a phase-locked loop). If the injection locking detector 150 detects a difference in phase (e.g., that the mixer output indicates the phase of the signal output from the injection-locking circuitry 110 is not locked to the phase of the injection signal), the tuning circuit 160 adjusts an output provided to the phase-tuning component 111 to cause the phase of the injection signal to be modified.

In some implementations, the injection locking approach carried out via the mixer 140 is effected during an initialization event in which a dummy FMCW signal is made and used to assess injection locking. If there is no error observed from injection locking, a full FMCW sequence is initiated. For instance, where no error is observed, the output of mixer 140 may be zero or otherwise negligible (e.g., there is no feedback between injection locking detector and tuning circuit).

In some implementations, one or more phase shifting circuits are utilized to shift the phase of signals provided to the mixer 140. By way of example a 90 degree phase shift circuit 130 is shown and operable for shifting the output signal from the injection-locking circuitry 110 provided to the mixer 140. In certain embodiments, respective 45 degree phase shift circuits are used to respectively shift the phase of the injection signal and output signal provided to the mixer 140, having similar effect.

Figure 1B:
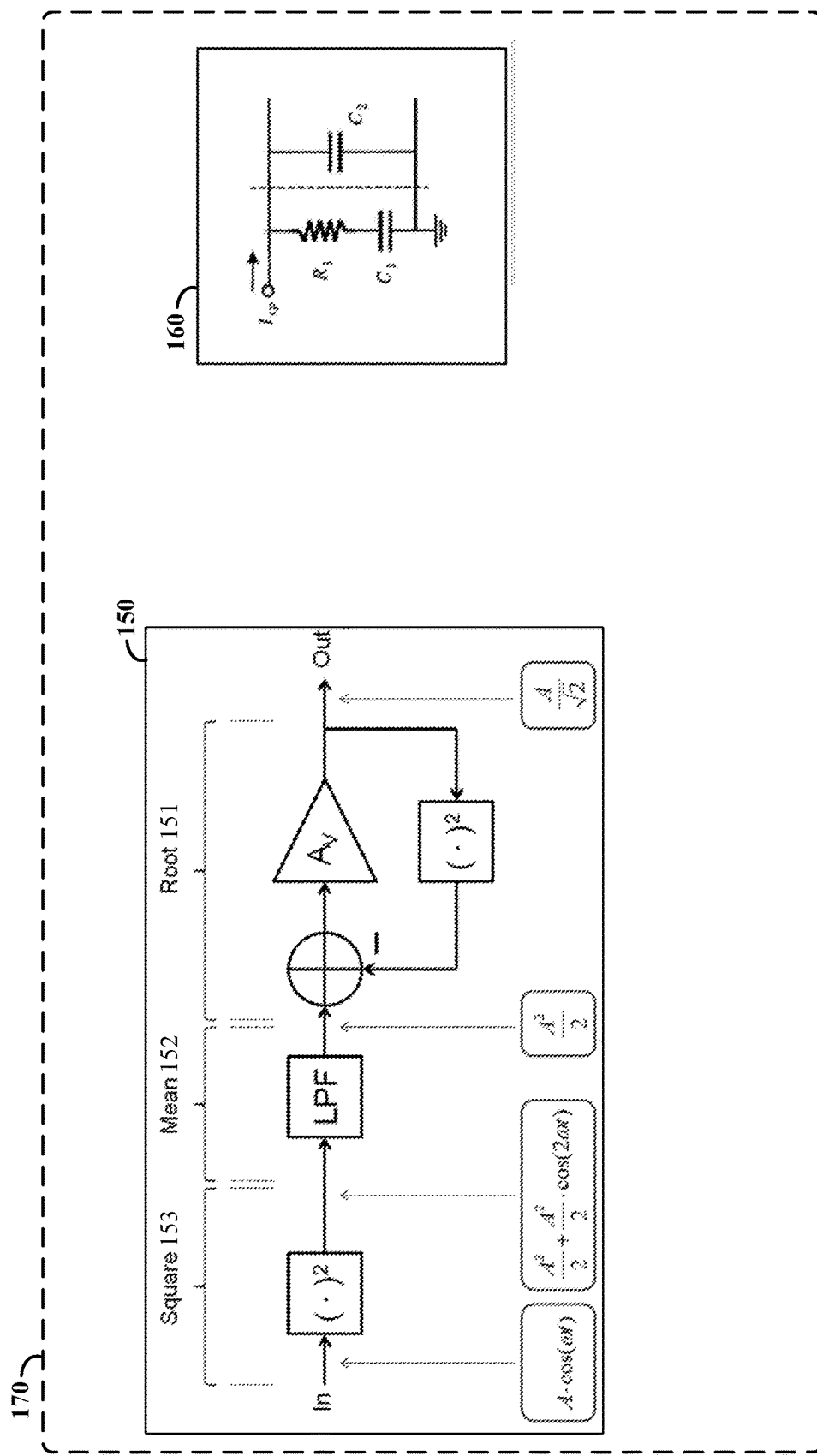
FIG. 1B shows an implementation of injection-locking circuitry including RMS circuitry, as may be implemented with the apparatus of FIG. 1A.

FIG. 1B shows an implementation of injection-locking circuitry, as may be utilized with feedback circuit block 170 of the apparatus in FIG. 1A. Injection locking detector 150 includes RMS detection circuitry as shown, including root (151), mean (152) and squaring (153) circuit components. Exemplary functions characterizing signals at the various positions in the circuit are shown as well. The tuning circuit 160, such as a low pass filter, may be implemented with capacitive circuitry, including capacitors C1 coupled to resistor R1, and capacitor C2 connected as shown.

Figure 1C:
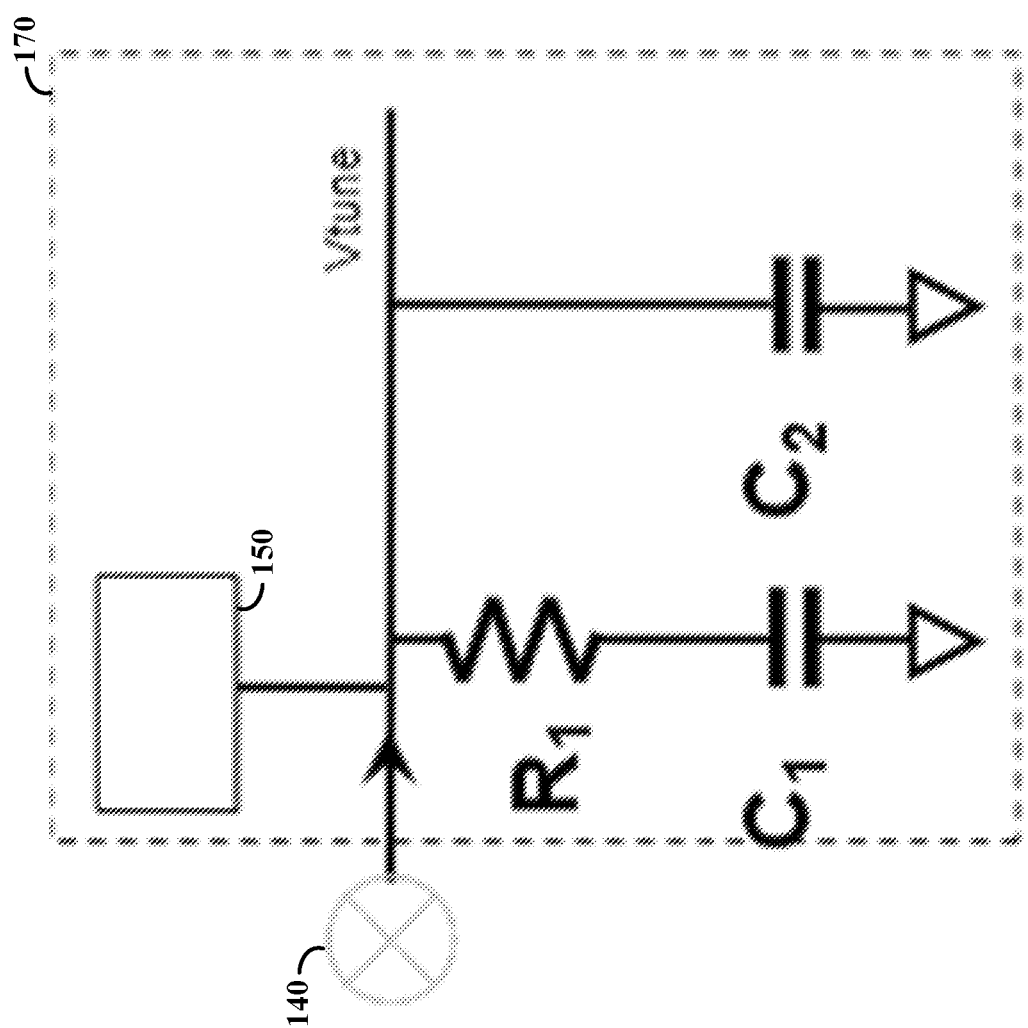
FIG. 1C shows another implementation of injection-locking circuitry, as may be implemented with the apparatus of FIG. 1A.

FIG. 1C shows another implementation of injection-locking circuitry, as may be utilized with feedback circuit block 170 of the apparatus of FIG. 1A, for providing a tuning voltage (Vtune) utilized for controlling phase-tuning component 111 (e.g., a filter such as a low pass filter). A phase detector 150 operates to detect phase differences between an injection signal and an amplified signal, in response to which the respective capacitors C1 and C2 along with resistor R1 set window in which Vtune is set. In this context, mixer 140 may effectively act as a phase detector via provision of an output when the phases do not match, with the circuitry 150 being responsive thereto.

Figure 2:
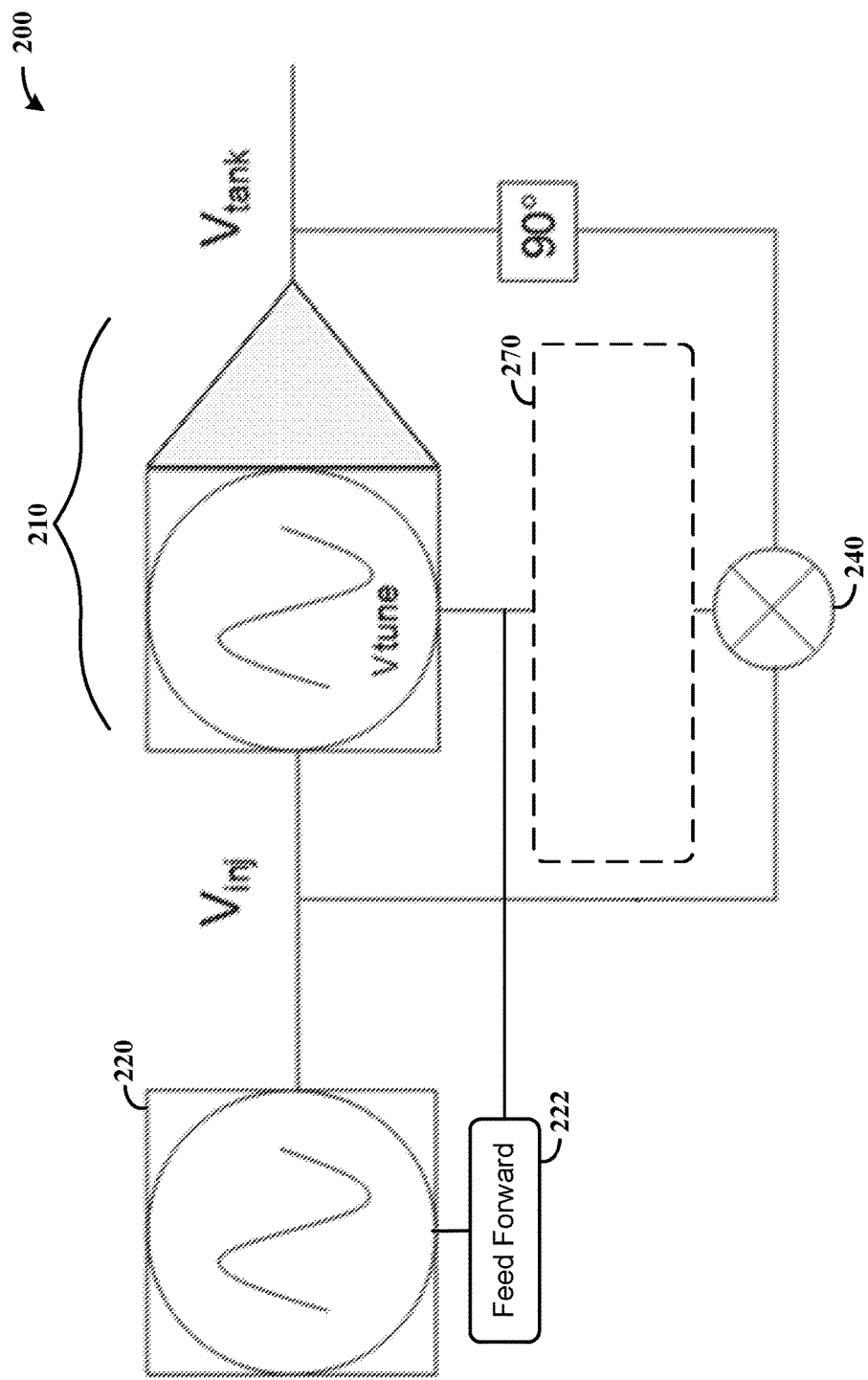
FIG. 2 shows an injection-locking apparatus with feed-forward circuitry, in accordance with the present disclosure.

FIG. 2 shows an injection-locking apparatus 200 with feed-forward circuitry 222, in accordance with the present disclosure. The apparatus 200 may, for example, be implemented in a manner similar to that shown with the apparatus 100 in FIG. 1. The feed-forward circuitry 222 operates to control frequency (and related phase) tuning of an injection-locked stage 210, based on the injection signal provided thereto. The apparatus may, for example, also include feedback circuitry including a mixer 240 that mixes the injection signal with an output from the injection-locked stage 210, and tuning circuitry 270 that generates a voltage signal for tuning the injection-locked stage when the injection signal and output of the injection-locking stage are out of phase. The feedback may be utilized to facilitate alignment of the feed forward compensation for different chirp bandwidths. In various implementations when feed forward operation is carried out, the mixer 240 and tuning circuitry 270 may be omitted.

Feed-forward circuitry 222 may operate in a variety of manners, to suit particular embodiments. For instance, the injection-locked stage 210 may include a varactor that is driven by a tuning voltage (Vtune). The varactor covers a frequency range, a smaller or larger range voltage can be set to facilitate phase locking. The voltage range may be set using a DAC, in which a tuning range can be defined that corresponds with a desired chirp bandwidth for the injection signal. The mixer 240 operates with an RMS detector in 270 to detect beat frequency. In these examples, the amplitude of the injection signal may be kept constant.

Figure 3:
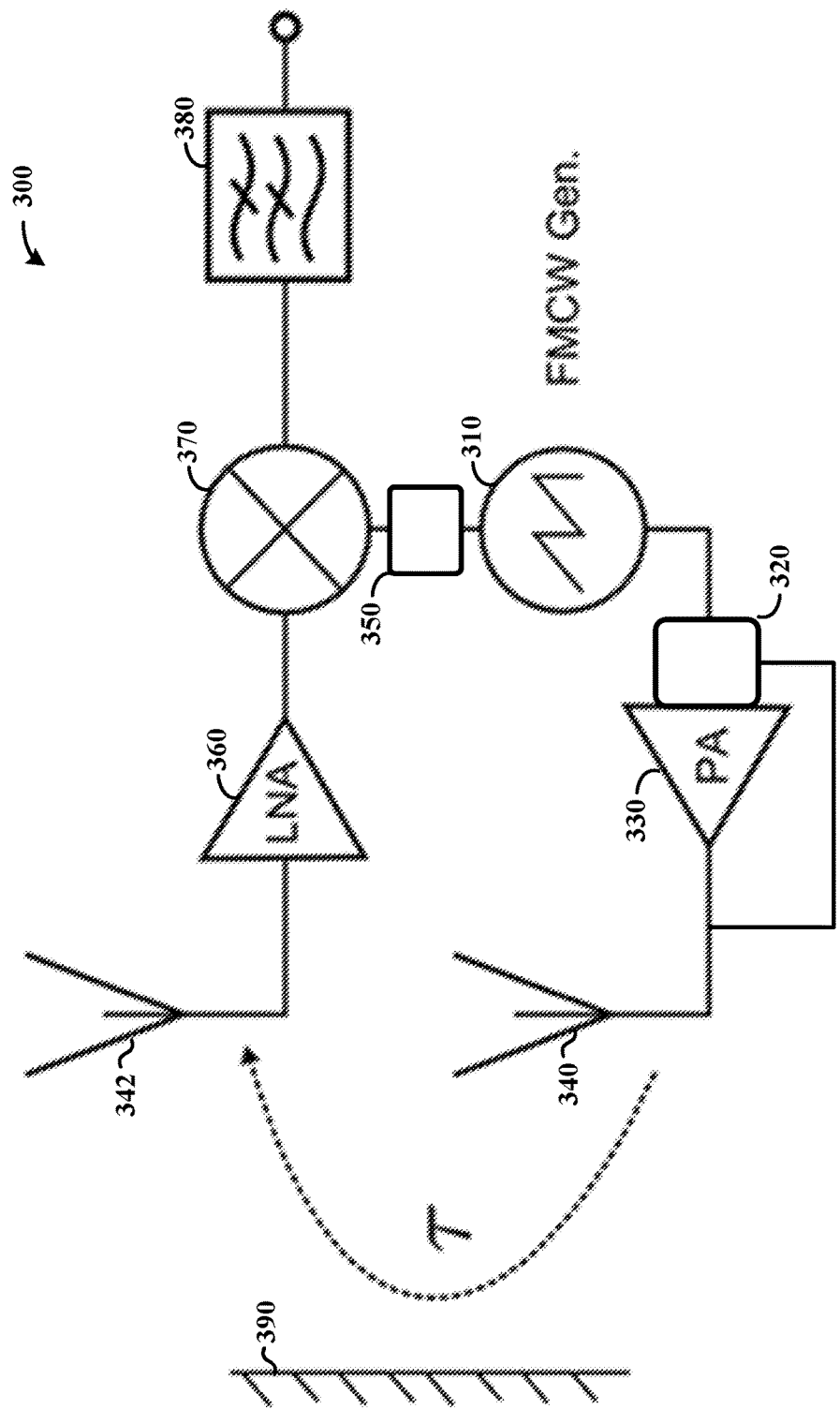
FIG. 3 shows a radar apparatus, in accordance with the present disclosure.

FIG. 3 shows a radar apparatus 300, in accordance with the present disclosure. The apparatus 300 includes an FMCW generator 310, an injection locking circuit 320, and an amplifier 330 that operate together to generate and transmit a radar signal via antenna 340. The apparatus includes receiver circuitry for receiving reflections of the transmitted radar signals, including an antenna 342 and amplifier 360. The mixer 370 mixes an amplified version of the received reflections from amplifier 360 with the FMCW signal, and may provide an output to circuitry 380 for processing in determining distance to an object 390. Phase locking circuitry 350 may be implemented and operate to provide phase locking with respect to the mixer 370.

The injection locking circuit 320 operates to adjust the phase of an output signal from the amplifier 330, based on a phase mismatch between the injection signal and an output of the amplifier 330. Such an approach may involve, for example, mixing the output of the amplifier 330 with the injection signal, detecting the presence or absence of a phase lock, and adjusting a tuning input (e.g., a tuning voltage applied to a varactor) for modifying the generation of the output signal from amplifier 330. Various such approaches may be carried out in a manner consistent with that discussed in connection with FIG. 1A or otherwise herein.

The skilled artisan would recognize that various terminology as used in the specification (including claims) connote a plain meaning in the art unless otherwise indicated. As examples, the specification describes and/or illustrates aspects useful for implementing the claimed disclosure by way of various circuits or circuitry which may be illustrated as or using terms such as blocks, modules, device, system, unit, controller, generator, oscillator, detector, mixer and/or other circuit-type depictions (e.g., reference numerals 150, 160 and 170 of FIG. 1 may depict a block/module as described herein). Such circuits or circuitry are used together with other components to exemplify how certain embodiments may be carried out in the form or structures, steps, functions, operations, or activities. For example, in certain of the above-discussed embodiments, one or more modules are discrete logic circuits or programmable logic circuits configured and arranged for implementing these operations/activities, as may be carried out in the approaches shown in the Figures. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described herein in connection with the tuning of an injection signal, and is used by such a programmable circuit to perform the related steps, functions, operations, and activities. Depending on the application, the instructions (and/or configuration data) can be configured for implementation in logic circuitry, with the instructions (whether characterized in the form of object code, firmware or software) stored in and accessible from a memory (circuit). As another example, where the specification may make reference to a "first [type of structure]", a "second [type of structure]", such as in the context of an amplifier and a receiver amplifier, etc., where the [type of structure] might be replaced with terms such as ["circuit", "circuitry" and others], the adjectives "first" and "second" or "receiver" may not necessarily be used to connote any description of the structure or to provide any substantive meaning; rather, such adjectives are merely used for English-language antecedence to differentiate one such similarly-named structure from another similarly-named structure (e.g., "first circuit configured to adjust . . . " is interpreted as "circuit configured to adjust . . . "). It should also be understood that the terminology is used for notational convenience only and that in actual use the disclosed structures may be oriented different from the orientation shown in the figures. Thus, the terms should not be construed in a limiting manner.

Based upon the above discussion and illustrations, those skilled in the art will readily recognize that various modifications and changes may be made to the various embodiments without strictly following the exemplary embodiments and applications illustrated and described herein. For example, aspects of FIG. 1A may be implemented separately, such as a separate phase-adjusting apparatus implemented with the circuitry in block 170 and mixer 140, as useful with a variety of types of injection locking. Block 170 may also be implemented with the mixer 140 and injection-locking circuitry 111 as a separate embodiment, also implementable with different types of injection locking. As another example, methods as exemplified in the Figures may involve steps carried out in various orders, with one or more aspects of the embodiments herein retained, or may involve fewer or more steps. For instance, a feedback circuit as shown with FIG. 1A can be utilized with a variety of injection locking circuits, such as those shown in FIG. 3. As another example, the apparatus shown in FIG. 3 can be implemented for non-radar functions, such as with a variety of other types of signaling approaches in which an injection signal is utilized. Such modifications do not depart from the true spirit and scope of various aspects of the disclosure, including aspects set forth in the claims.

What is claimed is:

1. An apparatus comprising:
   a plurality of injection-locking circuits to receive an injection signal that is used to generate an FM continuous wave (FMCW) chirp signal, each injection-locking circuit including a mixer to combine the injection signal with a representation of an output signal from the injection-locking circuit and further including a lock-detection circuit; and
   in each of the injection-locking circuits, the lock-detection circuit to detect a lock-status relationship between a phase of the injection signal, as received, and a phase of associated with the output signal from the injection-locking circuit and, in response to the lock-status relationship indicating an unlocked condition, adjust a phase of the output signal, and wherein in response to the lock-status relationship indicating a locked condition, the output signal is to be transmitted as a signal corresponding to the FMCW chirp signal.

2. The apparatus of claim 1, further including a phase-locked loop circuit to generate the injection signal to drive each of the plurality of injection-locking circuits, each of the injection-locking circuits having an amplifier configured to provide the output signal, using the injection signal, having a phase set via the injection locking circuit.

3. The apparatus of claim 1, wherein in each of the plurality of injection-locking circuits, the mixer is configured to combine the injection signal and a representation of the output signal and to provide an output indicative of a phase difference between the injection signal and the output signal.

4. The apparatus of claim 1, further including, for each of the plurality of injection-locking circuits, an injection circuit configured to generate the injection signal and a feed forward circuit configured to set an operating voltage of the injection-locking circuit based on the injection signal.

5. The apparatus of claim 4, wherein
   each of the injection-locking circuits is configured to set the phase of the output signal in response to a tuning voltage and the injection signal; and
   the feed forward circuit is configured and arranged to respond to an output of the injection circuit by setting a voltage range of the tuning voltage.

6. The apparatus of claim 1, wherein
the injection-locking circuits are configured to adjust the phase of the output signal generated from the injection signal in response to a tuning voltage; and
the lock-detection circuit is configured to adjust the phase of the output signal by setting a voltage range of the tuning voltage.

7. The apparatus of claim 6, wherein the lock-detection circuit includes capacitor circuitry configured to cause the tuning voltage to exhibit a voltage in the tuning range.

8. The apparatus of claim 1, wherein each of the plurality of injection-locking circuits includes a varactor configured to adjust the phase of the output signal based on a tuning voltage output of the lock-detection circuit.

9. A method comprising:
driving a plurality of injection-locking circuits with an associated injection signal that is used to generate an FM continuous wave (FMCW) chirp signal, wherein each of the plurality of injection-locking circuits includes a mixer and a lock-detection circuit; and
in each of the plurality of injection-locking circuits, using the lock-detection circuit to detect a lock-status relationship between a phase of the injection signal and a phase of a representation of an output signal from the injection-locking circuit and, in response to the lock-status relationship indicating
an unlocked condition, adjusting a phase of the output signal, and wherein in response to
a locked condition, the output is transmitted as a signal corresponding to the FMCW chirp signal.

10. The method of claim 9, wherein driving the plurality of injection-locking circuits includes using a phase-locked loop oscillator circuit to drive each of the plurality of injection-locking circuits, further including driving an amplifier via the injection signal to provide the output signal.

11. The method of claim 10, wherein using the lock-detection circuit to detect the lock-status relationship includes using a mixer to combine the output signal with a signal corresponding to the injection signal, and indicating the lock-status relationship via an output of the mixer.

12. The method of claim 11, wherein the output of the mixer is indicative of a phase difference between the injection signal and the output signal, wherein adjusting the phase of the output signal includes adjusting the phase of the output signal based on the phase difference.

13. The method of claim 9, further including using a feed forward circuit to set an operating voltage of the injection-locking circuit based on the injection signal and to reduce amplitude variation in the output signal.

14. The method of claim 9, wherein adjusting the phase of the output signal includes setting a voltage range of a tuning voltage supplied to the injection-locking circuit and using the tuning voltage to cause the injection-locking circuit to adjust the phase of the output signal.

15. The method of claim 9, wherein adjusting the phase of the output signal includes adjusting a tuning voltage of a varactor and therein causing the varactor to adjust the operating frequency of the injection-locking circuit.

16. An apparatus comprising:
an antenna;
an oscillator configured and arranged to generate an oscillating injection signal used for generation of an FM continuous wave (FMCW) radar signal;
an amplifier;
an injection-locking circuit configured and arranged with the amplifier to generate a phase-adjusted FMCW output signal based on the injection signal and a tuning voltage, the amplifier being configured and arranged to provide the output signal to the antenna for transmission; and
a feedback circuit including a lock-detection circuit and a tuning circuit:
the lock-detection circuit configured and arranged to detect a lock-status relationship between a phase of the injection signal and a phase of a representation of an output signal from the injection-locking circuit and, in response to the lock-status relationship indicating an unlocked condition, adjusting a phase of the output signal, and in response to a locked condition, the output signal is transmitted as a signal corresponding to the FMCW radar signal; and
the tuning circuit configured and arranged to supply the tuning voltage by:
comparing the phase of the output signal with the phase of the injection signal; and
in response to the comparing indicating a difference in the respective phases, setting the tuning voltage to cause the injection-locking circuit to adjust the phase of the output signal.

17. The apparatus of claim 16, wherein the feedback circuit is configured and arranged to extend a range of frequencies for which the injection-locking circuit is configured for locking to the injection signal.

18. The apparatus of claim 16, wherein injection-locking circuit is configured and arranged with the amplifier to amplify and transmit the FMCW output signal in response to the comparing indicating that the respective phases match.

19. The apparatus of claim 16, further including a receiver circuit configured and arranged to receive reflections of FMCW signals transmitted from the antenna, and to provide an output indicative of a distance between the antenna and an object from which the reflections emanate by mixing the received reflections with the FMCW injection signal.

20. The apparatus of claim 16, wherein the feedback circuit further includes:
a mixer circuit configured to mix the injection signal with the output signal, the comparing the phase of the output signal with the phase of the injection signal based on an output of the mixer;
and
wherein the tuning circuit includes a capacitor circuit configured and arranged to adjust the tuning voltage in response to the detected comparing indicating differences in the respective phases.

* * * * *